Figure 1:
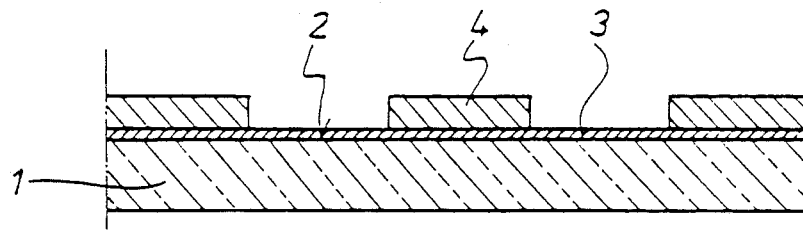

United States Patent [19]

Wild

[11] Patent Number: 5,063,658
[45] Date of Patent: Nov. 12, 1991

[54] EMBOSSING FOIL AND A METHOD OF MAKING

[75] Inventor: Alfred H. Wild, Fürth, Fed. Rep. of Germany

[73] Assignee: Leonard Kurz GmbH & Co., Fürth, Fed. Rep. of Germany

[21] Appl. No.: 457,751
[22] PCT Filed: Jan. 7, 1988
[86] PCT No.: PCT/DE88/00403
 § 371 Date: Dec. 8, 1989
 § 102(e) Date: Dec. 8, 1989
[87] PCT Pub. No.: WO89/00373
 PCT Pub. Date: Jan. 12, 1989

[30] Foreign Application Priority Data

Jul. 8, 1987 [DE] Fed. Rep. of Germany ....... 3722508

[51] Int. Cl.$^5$ .................... H05K 3/32; B32B 15/04
[52] U.S. Cl. ....................... 29/846; 428/457; 428/901; 156/233
[58] Field of Search ............ 156/233; 29/846, 848, 29/829; 428/901, 457

[56] References Cited

U.S. PATENT DOCUMENTS

| 2,984,597 | 5/1961 | Hennes . | |
|---|---|---|---|
| 2,987,595 | 5/1961 | Schumpelt et al. | 29/846 X |
| 4,306,925 | 12/1981 | Lebow et al. | 29/848 X |
| 4,415,607 | 11/1983 | Denes et al. | 428/901 X |
| 4,495,232 | 1/1985 | Bauser et al. . | |
| 4,586,976 | 5/1986 | Takano et al. | 156/233 |
| 4,604,160 | 8/1986 | Murakami et al. | 156/233 X |
| 4,676,857 | 6/1987 | Scharr et al. | 156/233 |
| 4,722,765 | 2/1988 | Ambros et al. | 29/846 X |
| 4,790,902 | 12/1988 | Wada et al. | 156/233 X |

FOREIGN PATENT DOCUMENTS

| 185998 | 7/1986 | European Pat. Off. . | |
|---|---|---|---|
| 1521042 | 7/1969 | Fed. Rep. of Germany . | |
| 56-55282 | 5/1981 | Japan | 156/233 |

OTHER PUBLICATIONS

IBM Tech. Discl. Bull., vol. 9, No. 10, Mar. 1967, pp. 1258-1259, by Lester et al.

Primary Examiner—Carl J. Arbes
Attorney, Agent, or Firm—Louis E. Marn

[57] ABSTRACT

Proposed is a method of producing an article which is provided on a surface thereof with conductor tracks at least in a region-wise manner, wherein the conductor tracks are first formed on an intermediate carrier and then transferred onto the substrate. In accordance with the method as described, an etching treatment for separation of the conductor tracks from each other is eliminated. An embossing foil of a particular configuration is used as the intermediate carrier with the conductor tracks.

21 Claims, 1 Drawing Sheet

EMBOSSING FOIL AND A METHOD OF MAKING

The invention relates to an embossing foil, in particular a hot embossing foil, for the production of conductor tracks on a substrate of electrically insulating material, the foil having a carrier foil which carries, in the regions in which there are no conductor tracks, a masking layer which prevents galvanic deposit of a metal layer and which is resistant to galvanic fluids, and, in the regions which are not covered by the masking layer, a metal layer which can be released from the carrier foil and which serves to form the conductor tracks.

There are various methods for producing articles which at a surface are provided at least in a region-wise manner with an electrically conductive metal layer forming conductor tracks on a substrate of electrically insulating material.

For example, DE 32 15 205 Al describes a method for the production of printed circuits, wherein the conductor tracks are provided on a plate or board of insulating material. In an identical method, conductor tracks can also be applied to other articles of plastic material, for example by means of what is known as the "Inmold" method. In that method a foil which carries a metal layer forming the conductor tracks is introduced into the mould for the production of the article and plastic material is then injected behind same so that, after removal of the article from the mould, the conductor tracks adhere to the surface of the article while the intermediate carrier can be stripped off.

In a procedure as disclosed in DE 32 15 205 Al, use is made of an intermediate carrier, in which a conductive attachment layer for the metal layer does not adhere too firmly so that, after application of the metal layer forming the conductor tracks to the substrate and removal of the intermediate carrier, the attachment layer is still stuck to the metal layer. The attachment layer then has to be removed in an etching operation. An etching operation of that kind suffers in particular from the disadvantage that it can only be carried out in especially equipped works which can ensure that the etching agent is satisfactorily disposed of. In addition it will be appreciated that any etching process involves risk to the persons dealing with the process. Finally etching apparatuses involve a considerable level of additional capital investment.

U.S. Pat. No. 4,586,976 describes the production of what are known as printed circuits without an etching procedure in such a way that, using a conductive carrier which can also be a foil, firstly a masking layer is applied thereto in a region-wise manner and then a metal layer is galvanically applied in the exposed regions. In that connection in principle reference is also made to the possibility of using a foil as the carrier, that is to say an embossing foil of the general kind set forth herein. In this connection however it is pointed out that, when handling a metal-plated foil as a carrier, there is the danger that delamination of the metal layer occurs as a result of bending, for which reason U.S. Pat. No. 4,586,976 proposes that the metal plating operation and the operation of applying the metal layer to the substrate are to be carried out in a continuous process. If therefore embossing foils were to be produced in accordance with U.S. Pat. No. 4,586,976, the problem would arise that those foils would be extremely sensitive, which is not acceptable in respect of embossing foils because they are frequently exposed to a very severe bending loading. In comparison therewith, U.S. Pat. No. 4,586,976 only refers to the use of a metal foil as the carrier foil, a 0.1 mm thick foil of stainless steel which is comparatively stiff being mentioned as an example.

EP-A-0 063 347 refers to the possibility of operating in a dry method in the production of printed circuits, wherein the conductor tracks are to be cut out of a copper foil applied to a carrier strip, which in fact is only possible when the carrier strip is very thick and the copper foil is comparatively thin. The production of an embossing foil in that way is extremely complicated. For that reason it is proposed in accordance with EP-A-0 063 347 that a continuous layer of copper be provided on the carrier strip, which copper layer must be of a quite particular configuration in order to ensure that the individual conductor tracks are cleanly severed or sheared off in the embossing operation. The conductor tracks themselves are then formed by a suitable embossing tool.

Now, taking the state of the art disclosed in U.S. Pat. No. 4,586,976 as the basic starting point, the invention is based on the object of so modifying the known foil that it is suitable for use as an embossing foil, that is to say on the one hand it is possible to eliminate the expensive and cost-intensive etching process which involves dangers from the point of view of the environment and health, while on the other hand the foil has sufficient stability for it to be handled and processed in the usual way in respect of embossing foils, in particular hot embossing foils.

To attain that object, it is proposed in accordance with the invention that the foil of the kind set forth in the opening part of this specification is such that the carrier foil is provided over its entire surface with an electrically conductive attachment layer which on its side remote from the carrier foil, carries on the one hand the masking layer and on the other hand the metal layer which is formed by galvanic deposit on the attachment layer, that the masking layer and the metal layer are covered on their surfaces remote from the carrier foil by a common bonding layer for securing to the substrate, and that the bonding layer comprises a material which adheres to the metal layer substantially better than to the masking layer which in turn adheres to the attachment layer better than the attachment layer adheres to the carrier foil in the region of the metal layer.

An embossing foil of that kind, in particular a hot embossing foil, has substantial advantages over the known foils or laminates. In particular an embossing foil of that kind may be produced without difficulty in a continuous operation, substantially with the processes known from the production of embossing foils. That produces a foil in which the metal layer, even when the foil is subjected to bending, has no tendency to flake off the carrier foil so that it can be handled and processed in the usual fashion concerning embossing foils. The operation of applying the metal layer to the substrate can then be carried out in a per se known hot embossing process which can also be carried out continuously so that use of the embossing foil also affords the advantage of a substantially continuous mode of operation. By virtue of the appropriate choice on the one hand in respect of the bonding layer for fixing the metal layer forming the conductor tracks on the substrate and on the other hand in respect of the masking layer, the invention provides that, when the carrier foil is removed, the masking layer is also removed therewith while the metal layer forming the conductor tracks is released from the carrier foil and adheres to the substrate. In such a procedure either the entire attachment layer remains on the intermediate carrier if suitable preliminary treatment of the carrier foil and the manner of performing the galvanic method for deposit of the metal layer means that it is possible to separate the galvanically formed conductor tracks from the attachment layer without applying a large amount of force, or the attachment layer is torn away at the interfaces between the conductor tracks and the masking layer, if the adhesion of the attachment layer relative to the intermediate carrier is worsened in the region of the galvanically formed conductor tracks, whereby the attachment layer remains on the carrier foil only in the region of the masking layer, but remains joined to the conductor tracks in the region thereof. At any event, when processing an embossing foil in accordance with the invention, that provides that the attachment layer is removed at least in the region of the masking layer with the carrier foil so that there are no longer any electrical contacts between the conductor tracks, through the attachment layer, which means that it is possible to completely eliminate the previously conventional etching process, so that all problems which the previous etching processes involved are eliminated in a simple fashion. The desired effect in regard to adhesive strength or release of the metal layer on the one hand and the masking layer on the other hand, relative to the carrier foil and the substrate respectively, can be achieved without major problems, from the point of view of the man skilled in the art, by choosing suitable materials or material compositions. For example the man skilled in the art is aware of classes of bonding layers, that is to say essentially adhesives, which on the one hand have good adhesion to a metal layer but which on the other hand do not form a particularly strong bonding action with certain masking layers which are highly suitable for use for the purposes of the invention.

The attachment layer is generally desirably a thin metal layer which is applied for example by sputtering or by vapour deposit. For certain situations of use however it may also be desirable for the attachment layer to be in the form of a thin layer of an activated lacquer because in that case it is possible for example to use a lacquer which provides a very good bonding effect on the one hand to the carrier foil and on the other hand to the masking layer, but which can be influenced in particular by the galvanic process for applying the metal layer, in such a way that when the conductor tracks are transferred onto the substrate, the metal layer forming the conductor tracks is then easily released from the attachment layer.

A very wide range of different materials can be used as the carrier foil provided that they ensure that the attachment layer adheres sufficiently strongly to such materials. It is particularly desirable however to use a plastic foil, preferably a polyester foil, because on the one hand a foil of that kind has the required properties in regard to the adhesive strength of the attachment layer while on the other hand the structure forming the conductor tracks can be very satisfactorily manufactured and stored. For example when the embossing foil is in the form of a hot embossing foil, the attachment layer may be applied in a conventional vapour deposit or lacquering process and the masking layer may be applied by a lacquering operation.

It is further provided in accordance with the invention that an intermediate layer may be provided between the attachment layer and the carrier foil, optionally only in a region-wise manner. That intermediate layer may be provided for example only in the region of the subsequent masking layer, in which case it is then necessary to use an intermediate layer which improves the adhesion of the attachment layer to the intermediate carrier. Another possibility is that of applying the intermediate layer in the regions of the intermediate carrier, which subsequently form the conductor tracks. In that case it is necessary to use an intermediate layer which reduces the adhesion of the attachment layer on the intermediate carrier, for example a suitable wax layer.

Various adhesives may be used for the bonding layer. It is particularly advantageous however if the bonding layer is formed from a heat-sealable adhesive because such an adhesive permits handling of the laminate carrying the conductor tracks, prior to the conductor tracks being transferred onto the substrate, without the risk of sticking to something, but on the other hand heat-sealable adhesives are known, which provide an excellent combination of the properties required in regard to adhesive relative to the conductor tracks on the one hand, and in regard to poor bonding to the masking layer on the other hand.

It will be appreciated that the masking layer must be so selected, in regard to the properties thereof, that it is in no way adversely affected by the galvanic process for forming the conductor tracks. That may be achieved in a very simple manner if the masking layer is formed by an insulating lacquer. Another possibility is that of making the masking layer from a wax, in particular a modified lignite and/or polyolefin wax. Waxes of that kind melt when subjected to the effect of heat. Even if in such a situation the bonding layer should have comparatively good adhesion to the masking layer, then, in the operation of transferring the conductor tracks from the laminate onto the substrate, with the interposition of the bonding layer, reliable separation of the attachment layer is achieved in the region of the masking layer, from the bonding layer and the substrate respectively, namely by possibly melting the masking layer if the masking layer should not in any case come away from the bonding layer.

Tests have shown that the desired effects can be achieved in a highly satisfactory manner if the masking layer is made from a lacquer from the class of materials comprising polyurethanes, polyamide resins and/or silicone resins and the bonding layer is made from a hot-bonding material from the class comprising polyester resins, polyvinyl chlorides and/or modified acrylic resins. Choosing those substances ensures that the bonding layer and the masking layer have only little adhesion to each other, whereas the bonding layer and the conductor tracks or metal layer have very good adhesion to each other, thereby reliably ensuring separation thereof when transferring the conductor tracks onto the substrate.

Whereas hitherto it was generally assumed that, when transferring the conductor tracks onto the substrate, the attachment layer is subdivided and, in the region of the conductor tracks, passes therewith onto the substrate, under some circumstances it is possible to provide that the attachment layer remains entirely on the carrier foil if a thin metallic separating layer for example of silver is provided in the regions which are not covered by the masking layer, between the metal layer and the attachment layer. Such separating layers are in principle known for example from electroforming processes. The use of a silver layer as the separating layer has the advantage in that respect that contacting of the metal layer forming the conductor tracks is facilitated or improved.

Figure 2:
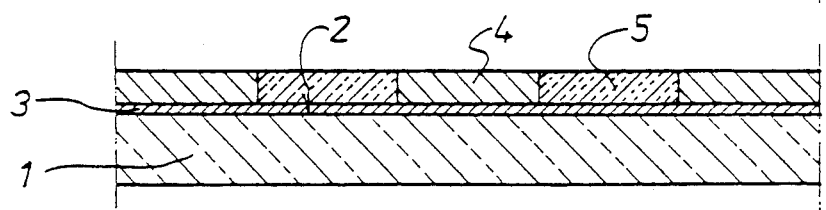
Figure 3:
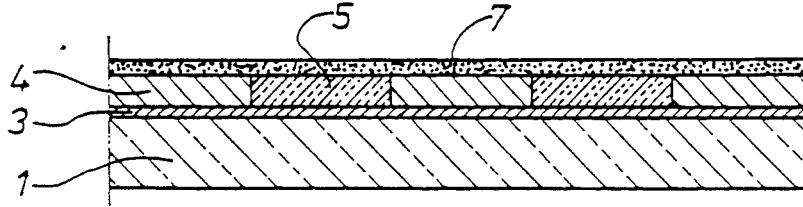
Figure 4:
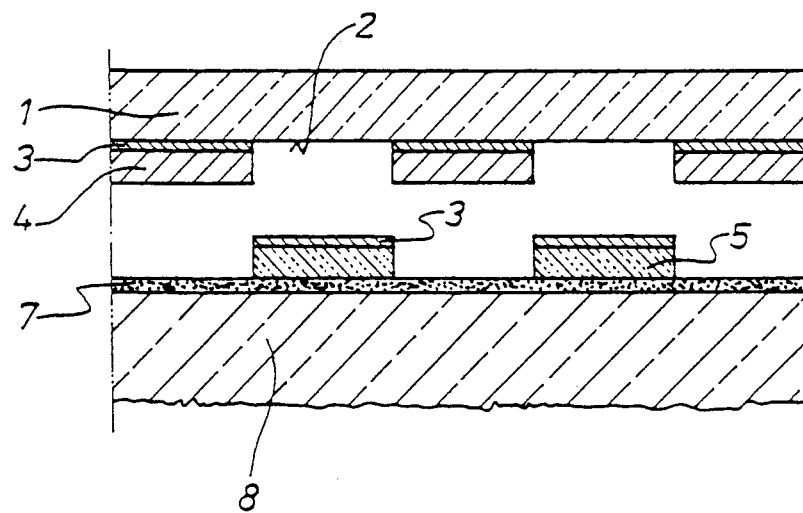

Further features, details and advantages of the invention will be apparent from the following description of embodiments of the embossing foil, with reference to the drawing in which:

FIGS. 1 to 3 show an embossing foil according to the invention in different stages of production, and FIG. 4 shows the configuration which is produced when applying conductor tracks to a substrate using an embossing foil according to the invention.

The embossing foil shown in FIGS. 1 to 3 includes a carrier foil 1. It is one of the carriers which are conventionally used in relation to embossing foils, for example a polyester foil which is about 23 μm in thickness. Over its entire surface 2, the carrier foil 1 carries an attachment layer of electrically conductive material, for example a layer of copper of a thickness of from 50 to 100 nm, which is applied by a vapour deposit operation in a high vacuum. In order to provide for particularly good adhesion of the attachment layer 3 on the carrier foil 1, the surface 2 of the carrier foil is desirably (subjected to a corona discharge treatment) prior to the vapour deposit of the attachment layer 3.

The embossing foil shown in FIGS. 1 to 3 includes a carrier foil 1 which serves as an intermediate carrier. In that connection, it is one of the carriers which are conventionally used in relation to embossing foils, for example a polyester foil which is about 23 μm in thickness. Over its entire surface 2, the carrier foil 1 carries an attachment layer 3 of electrically conductive material, for example a layer of copper of a thickness of from 50 to 100 nm, which is applied by a vapour deposit operation in a high vacuum. In order to provide for particularly good adhesion of the attachment layer 3 on the carrier foil 1, the surface 2 of the carrier foil 1 is desirably subjected to a corona discharge treatment, prior to the vapour deposit of the attachment layer 3.

The attachment layer 3 does not necessarily have to consist of a metal layer. It would also be possible for example to use as the attachment layer another layer which permits galvanic deposit of metal, for example a layer of a suitably activated lacquer. The use of a lacquer as the attachment layer 3 affords the possibility that the adhesion properties of the attachment layer 3 relative to the carrier foil 1 on the one hand and relative to the materials on the other side of the attachment layer 3 can be adjusted to a certain extent.

When producing the embossing foil for the purpose of the present invention, as can be seen from FIG. 1, a masking layer 4 is then applied to the attachment layer 3 in the regions which are subsequently not to have any conductor tracks. The masking layer 4 is to have the property that it adheres very firmly to the attachment layer 3, for example a vapour-deposited metal layer. Preferably insulating lacquers in the class of materials comprising polyurethanes, polyamide resins and/or silicone resins are used as the masking layer 4. Another possibility is that of using a wax, in particular a modified lignite and/or polyolefin wax, as the masking layer. The use of waxes when employing the foil in a hot embossing process affords the advantage that the melting point of the wax can be so adjusted as to ensure reliable separation.

After application of the masking layer 4, as shown in FIG. 1, the carrier foil 1 with the attachment layer 3 which is exposed in the regions between the masking layer 4 is subjected to a galvanic process in which further metal is galvanically deposited on the attachment layer 3, where it is not covered by the masking layer 4, thereby to form the metal layer 5 which subsequently provides the conductor tracks. In the embodiment shown in FIG. 2 deposit of the metal forming the metal layer 5 occurs directly subsequently to the application of the masking layer 4.

Figure 2A:
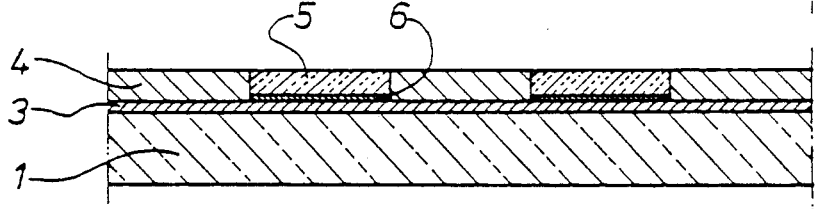

The embodiment shown in FIG. 2a differs from that shown in FIG. 2 in that, prior to the operation for the deposit of the metal layer 5, a separating layer 6, for example a thin layer of silver, is first galvanically formed on the attachment layer 3. The use of such separating layers is known for example from electroforming processes. The purpose of those separating layers is to permit the galvanically formed layer 5 to be easily released from the attachment layer 3. If a separating layer 6 of that kind is not included, the adhesion of the attachment layer 3 to the carrier foil 1, which was originally improved by the corona discharge treatment, is generally nullified again by the galvanic treatment of the attachment layer 3 for deposit of the metal layer 5 so that the generally metallic attachment layer 3 can be relatively easily released from the carrier foil 1 in the region under the galvanically formed metal layer 5.

After application of the masking layer 4 and galvanic formation of the metal layer 5 on the carrier foil 1 with the attachment layer 3, the embossing foil is then completed by the application of a bonding layer 7, for example a layer of a hot-setting adhesive, to the free surface of the masking layer 4 and the metal layer 5. The bonding layer must be such that it presents very good adhesion with respect to the metal layer 5 but on the other hand has no adhesion at all or only very poor adhesion, to the masking layer 4. That is intended to provide that, when the metal layer 5 is transferred onto the substrate, the metal layer 5 is very firmly bonded to the substrate by way of the bonding layer 7 while the masking layer 4 is not bonded to the substrate or is only very lightly bonded thereto so that, upon removal of the carrier foil 1 which serves as the intermediate carrier, the masking layer 4 and, at least in the region thereof, the attachment layer 3, are removed from the substrate, while the metal layer 5 and possibly the attachment layer 3 in the region of the metal layer 5 remain on the substrate, thus forming the conductor tracks.

That procedure is shown in FIG. 4. The upper half of FIG. 4 shows the carrier foil 1 of the embossing foil with parts of the attachment layer 3 and the masking layer 4. The lower half in FIG. 4 shows that the metal layer 5 forming the conductor tracks is fixed on the substrate 8 by means of the bonding layer 7 while the corresponding regions of the attachment layer 3 are fixed on the metal layer 5.

If manufacture of the structure shown in FIG. 4 does not involve the use of an embossing foil corresponding to the configuration shown in FIGS. 2 and 3, but an embossing foil in which, as shown in FIG. 2a, a separating layer 6 for the purposes of release of the metal layer 5 is also provided on the attachment layer 3, then only a metal layer 5 is obtained, after the operation of transferring the foil onto the substrate 8. The attachment layer 3 remains entirely on the carrier foil 1 because the separating layer 6 facilitates separation as between the metal layer 5 and the attachment layer 3. In particular when using a separating layer it is then also possible to use a masking layer 4 which tears away substantially parallel to the surface of the carrier foil 1, for example due to a softening effect caused by heating or due to a low level of mechanical strength. It is immaterial if some masking layer 4 is still to be found on the bonding layer 7 between the regions of the metal layer 5 which form the conductor tracks, insofar as the masking layer 4 is only insulating. The only important consideration is that there is no conducting connection through the attachment layer 3 between the regions of the metal layer 5 which form the conductor tracks.

An example of production of an embossing foil according to the invention will now be described:

In a first step in the method, a polyester foil which is about 23 μm in thickness is subjected to a corona discharge treatment on its surface 2.

Copper is then deposited by a vapour deposit operation in per se known manner in a high vacuum on the appropriately treated surface 2 of the polyester foil 1, the thickness of the copper layer being from 50 to 100 nm, thereby forming the attachment layer 3.

The carrier foil 1 which is thus provided with a layer of metal as the attachment layer 3 is then provided with the masking layer 4 in the form of a negative mask. For that purpose for example the following lacquer is applied by means of a conventional printing process, the weight of the lacquer in relation to surface area being from 5 to 10 g/m:

|  | Parts by weight |
| --- | --- |
| Ethyl acetate | 350 |
| Methyl ethyl ketone | 300 |
| hydrofunct. acrylic resin | 150 |
| (5–10% hydroxyl group content) |  |
| aromat. isocyanate | 200 |
| (5–10% NCO-group content) |  |

After the printed lacquer has set, the metal layer 5 is formed by cathodic deposit in an acid electrolyte bath for the purposes of forming the foil as shown in FIG. 2. For that purpose it is possible for example to use a bath of the following composition:

|  | Parts by weight |
| --- | --- |
| Distilled H$_2$O | 1000 |
| CuSO$_4$ | 50 |
| H$_2$SO$_4$ (98%) | 10 |
| L-ascorbic acid | 5 |

By virtue of the electrolytic reinforcement effect, it is possible for the metal layer representing the conductor tracks to attain a thickness of from 7 to about 50 μm. If operation is effected under the conditions set out below, when using copper, the thickness of the layer is from 10 to 14 μm:

| Deposit voltage | 1.5 V |
| --- | --- |
| Current density | about 5 to 7 mA/cm$^2$ |
| Deposit period | about 20 to 30 minutes |
| Bath temperature | 35° C. |

In this connection it should be pointed out that the thickness of the metal layer 5 increases in proportion to increases in current density, deposit voltage and deposit period. It is however necessary to ensure that operation is not effected with an excessively high current density in order to avoid damaging the attachment layer 3. If those conditions are observed, contacting is a very simple matter because it is only generally the attachment layer 3, which extends substantially over the entire surface of the carrier foil 1, that has to be contacted. It is possible for example when producing an embossing foil in accordance with the invention, to operate without difficulties in a continuous mode of operation, that is to say with the carrier foil 1 with the attachment layer 3 passing through a bath.

After leaving the galvanic bath, the carrier foil 1 with the various layers is cleaned, for example by a neutralizing liquid and/or distilled water. It is then dried. Those operations can also be easily carried out in a continuous mode of operation.

After the cleaning and drying operations, a heat-sealable adhesive layer 7 is then applied to the free surface of the masking layer 4 and the metal layer 5, with the weight of the layer 7 in relation to surface area being from 0.5 to 3.00 g/m. The following adhesive can be used:

|  | Parts by weight |
| --- | --- |
| Methyl ethyl ketone | 800 |
| Linear thermoplastic copolyester | 200 |

After drying or setting of the adhesive, the embossing foil is finished. It can then be transferred by a conventional embossing process onto an insulating substrate, for example to form a circuit board, or it can be applied to the surface of an injection-moulded article by the process which is known as the "Inmold" process, that is to say by introducing it into an injection moulding mould and injecting material behind it. After the metal layer 5 has been applied to the surface of the substrate by means of the bonding layer 7, the carrier foil 1 with the attachment layer 3 is then stripped off, in the manner already described above, thereby producing, without further post-treatment, an article which is provided on its surface with conductor tracks for example for forming a printed circuit.

A modificaiton in the above-described specific embodiment provides that a thin separating layer 6 of silver is deposited on the attachment layer 3 prior to the operation for deposition of the metal layer 5, under the conditions which are generally known from electroforming processes. In that case it is possible for the masking layer 4 to comprise not only a lacquer, as in the above-described specific embodiment, but also modified lignite and/or polyolefin waxes, that is to say waxes which on the one hand are resistant to galvanic baths but which on the other hand ensure easy removal to produce the effect that the invention seeks to attain.

I claim:
1. An embossing foil, which comprises:
   a carrier foil;
   an electrically conductive attachment layer disposed over the whole surface of said carrier foil;
   a masking layer in negative image format disposed on said electrically conductive layer, said masking layer being formed of a material preventing galvanic deposition and of selectively adhesive properties for said attachment layer;
   a galvanically deposited metal layer on said electrically conductive layer in areas between said masking layer, said metal layer being of a thickness sufficient to constitute conductor tracks; and a bonding layer disposed on said combined masking layer and said metal layer, said bonding layer formed of a material being of selectively adhesive properties for said metal layer.

2. The embossing foil according to claim 1 wherein said attachment layer is a metal layer applied by sputtering or vapour depositing techniques.

3. The embossing foil according to claim 1 wherein said attachment layer is a layer of an activated lacquer.

4. The embossing foil according to claim 1, 2, or 3 and further including an intermediate layer provided between said attachment layer and said carrier foil.

5. The embossing foil according to claim 1, 2 or 3 wherein said bonding layer is a heat-sealable adhesive.

6. The embossing foil according to claim 1, 2 or 3 wherein said masking layer is an insulating lacquer.

7. The embossing foil according to claim 1, 2 or 3 wherein said masking layer is a wax.

8. The embossing foil according to claim 1, 2 or 3 wherein said masking layer is formed of a material selected from the group consisting of polyurethanes, polyamide resins and silicone resins and said bonding layer is formed of a material selected from the group consisting of polyester resins, polyvinyl chlorides and modified acrylic resins.

9. The embossing foil according to claim 1, 2 or 3 and further including a galvanically deposited layer provided in regions of said attachment layer covered by said masking layer.

10. The embossing foil according to claim 9 wherein said galvanically deposited layer is formed of silver.

11. A method for manufacturing an embossing foil having transferable conductor tracks, which comprises:
  a) applying a continuous conductive attachment layer to a carrier foil;
  b) selectively applying a masking layer in negative image format to said attachment layer of step a), said masking layer being formed of a material preventing galvanic deposition;
  c) galvanically depositing a metal layer on said attachment layer not selectively covered by said masking layer, said metal layer being of a thickness sufficient to form conductor tracks; and
  d) applying a bonding layer onto the resulting metal and masking layers of step c), said bonding layer having selective adhesive properties for said metal layer thereby forming said embossing foil.

12. The method according to claim 11 wherein said metal layer is applied by sputtering or vapour deposition techniques.

13. The method according to claim 11 wherein an activated lacquer is applied as an electrically conductive attachment layer.

14. The method according to claim 11, 12 or 13 wherein said carrier foil is plastic foil, preferably a polyester foil.

15. The method according to claim 14 wherein prior to step a), said plastic foil is subjected to a corona discharge treatment.

16. The method according to claim 11, 12 or 13 wherein prior to step c) an intermediate layer is applied region-wise in non-masked layered areas.

17. The method according to claim 11, 12 or 13 wherein said bonding layer is formed of a heat-sealable adhesive.

18. The method according to claim 11, 12 or 13 wherein said masking layer is formed of an insulating lacquer.

19. The method according to claims 11, 12 or 13 wherein said masking layer is formed of a wax.

20. The method according to claim 11, 12 or 13 wherein said masking layer is formed of a material selected from the group consisting of polyurethanes, polyamide resins and silicone resins and said bonding layer is formed of a material selected from the group consisting of polyester resins, polyvinyl chlorides and modified acrylic resins.

21. The method according to claim 16 wherein silver is deposited prior to step c) on said regions of said attachment layer.

* * * * *

UNITED STATES PATENT AND TRADEMARK OFFICE
CERTIFICATE OF CORRECTION

PATENT NO. : 5,063,658
DATED : November 12, 1991
INVENTOR(S) : Wild

It is certified that error appears in the above-identified patent and that said Letters Patent is hereby corrected as shown below:

On the title page:
The filing date of PCT should be July 1, 1988 instead of January 7, 1988.

Signed and Sealed this

Eleventh Day of May, 1993

Attest:

MICHAEL K. KIRK

Attesting Officer

Acting Commissioner of Patents and Trademarks